US007722963B2

(12) United States Patent
Ido et al.

(10) Patent No.: US 7,722,963 B2
(45) Date of Patent: May 25, 2010

(54) RESIN PRODUCT HAVING A METALLIC COATING

(75) Inventors: Takayasu Ido, Aichi-ken (JP); Hiroshi Watarai, Aichi-ken (JP); Chiharu Totani, Aichi-ken (JP); Tetsuya Fujii, Aichi-ken (JP); Mitsuo Yoshida, Sagamihara (JP)

(73) Assignees: Toyoda Gosei Co., Ltd., Aichi-pref. (JP); Shinko Nameplate Co., Ltd., Kanagawa-ken (JP)

( * ) Notice: Subject to any disclaimer, the term of this patent is extended or adjusted under 35 U.S.C. 154(b) by 652 days.

(21) Appl. No.: 11/600,092

(22) Filed: Nov. 16, 2006

(65) Prior Publication Data

US 2007/0117380 A1 May 24, 2007

(30) Foreign Application Priority Data

Nov. 21, 2005 (JP) ............................ 2005-336422

(51) Int. Cl.
*B32B 15/08* (2006.01)
*B32B 15/04* (2006.01)
*B32B 15/20* (2006.01)
*C23C 14/14* (2006.01)
*C23C 14/20* (2006.01)

(52) U.S. Cl. ....................... 428/626; 428/642; 428/650; 428/670

(58) Field of Classification Search ....................... None
See application file for complete search history.

(56) References Cited

U.S. PATENT DOCUMENTS

| | | | | |
|---|---|---|---|---|
| 4,101,402 A * | 7/1978 | Vossen et al. | .......... | 204/192.14 |
| 6,391,457 B1 * | 5/2002 | Welty et al. | ................. | 428/412 |
| 6,399,219 B1 * | 6/2002 | Welty et al. | ................. | 428/626 |
| 2007/0115167 A1 * | 5/2007 | Fujii et al. | .................... | 342/70 |

FOREIGN PATENT DOCUMENTS

| | | | | |
|---|---|---|---|---|
| JP | B2-S59-040105 | | | 9/1984 |
| JP | 60140543 | A | * | 7/1985 |
| JP | 03274261 | A | * | 12/1991 |
| JP | 06334341 | A | * | 12/1994 |
| JP | 09011390 | A | * | 1/1997 |
| JP | A-H10-193549 | | | 7/1998 |
| JP | A-2005-249773 | | | 9/2005 |
| JP | A-2005-317070 | | | 11/2005 |
| JP | A-2006-227916 | | | 8/2006 |
| JP | 2007093241 | A | * | 4/2007 |
| JP | 2007162125 | A | * | 6/2007 |
| WO | WO 2004032590 | A1 | * | 4/2004 |

* cited by examiner

*Primary Examiner*—Aaron Austin
(74) *Attorney, Agent, or Firm*—Posz Law Group, PLC

(57) ABSTRACT

The present invention provides a metallic coating having a sheen and having a discontinuous structure at high productivity and low cost by using sputtering. A resin product includes a resin base material, and a metallic coating having a sheen and a discontinuous structure that is deposited on the resin base material so as to include a portion in which a high-formation metal that relatively readily forms a discontinuous structure when using vacuum vapor deposition is sputtered, and thereafter, a low-formation metal that does not relatively readily form a discontinuous structure when using vacuum vapor deposition is sputtered. The high-formation metal and the low-formation metal are selected from at least two species of metals whose crystal structures are identical and whose lattice constant difference is within 10%.

4 Claims, 10 Drawing Sheets

RESIN PRODUCT HAVING A METALLIC COATING

INCORPORATION BY REFERENCE

The present application claims priority under 35 U.S.C. §119 to Japanese Patent Application No. 2005-336422 filed on Nov. 21, 2005, which is incorporated herein by reference in its entirety.

TECHNICAL FIELD

The present invention relates to a resin product having a metallic coating that has a sheen and a discontinuous structure, a manufacturing method for the same, and a deposition method for the metallic coating, and is used for a millimeter wave radar apparatus cover and other various uses.

BACKGROUND OF THE INVENTION

In order to warn a driver that the automobile is approaching an object in its vicinity, providing a millimeter wave radar apparatus for measuring distance on each part of an automobile, for example, behind the radiator grill, the side moldings, the back panels, and the like, is under study. However, in the case in which the radiator grill and the like are provided with a sheen by using a metallic coating, this metallic coating blocks or greatly attenuates the millimeter waves. Thus, the path of the millimeter waves of the radar apparatus must be covered by a radar apparatus cover that has a sheen and has millimeter wave transparency. In order for the metallic coating to be transparent to millimeter waves, a discontinuous structure is necessary. In this discontinuous structure, the metallic coating does not form one continuous surface, but instead it has a structure (sea-island structure) in which many fine metal films are spread over the surface in a state in which they are slightly separated from each other or have portions thereof in contact so as to coalesce into islands.

In the case of the conventional millimeter wave radar apparatus cover, the metallic coating having a sheen and discontinuous structure is formed by depositing a single metal such as In or Sn by using a vacuum vapor deposition method. This is because metals such as In, Sn and the like have the quality of readily forming a discontinuous structure. Most metals do not exhibit this quality significantly, and if they are deposited by using vacuum vapor deposition, the metal becomes continuous at the point in time when enough of the metal has been deposited to obtain a region of a coating thickness that attains a sheen that is adequate in terms of external appearance. Consequently, the electrical resistance becomes low, and the millimeter wave transparency becomes insufficient.

(1) However, there are problems in that In in particular is expensive and the product cost becomes high. Thus, reducing the amount of In that is used and using metals other than In are being pursued.

(2) In addition, when metals such as In and Sn, which readily form a discontinuous structure by using vacuum vapor deposition, are deposited by using sputtering, it has not been possible to form a sufficiently distinct discontinuous structure, and as a result, a substantially continuous structure is acquired, the electrical resistance becomes low, and the millimeter wave transparency becomes insufficient. In addition, when a continuous structure has been acquired, corrosion of the metallic coating spreads easily and the corrosion resistance is thereby reduced. Thus, corrosion may occur, for example, due to the heat applied during the insert injection molding of an AES resin or the like that is carried out during the manufacturing process of the millimeter wave radar apparatus cover, and defects in the external appearance may thereby be caused. However, because sputtering is characterized in having both a superior productivity and a lower cost compared to vacuum vapor deposition, establishing a manufacturing method for a metallic coating having a sheen and a discontinuous structure by using sputtering is being pursued.

The following patent documents are examples of prior art that relates to the present invention.

Japanese Examined Patent Application Publication No. JP-B-S59-40105 discloses a metallic thin film made by sputtering a stainless steel or a nickel-chrome alloy being provided on a pliable and shiny product such as a front grill.

Japanese Patent Application Publication No. JP-A-2005-249773 discloses a molded product disposed in a radar apparatus beam path that provides a shiny decorative layer made by vacuum vapor depositing or sputtering In, an In alloy, Sn, or a Sn alloy, on a base material surface made of a cyclic polyolefin.

Japanese Patent Application Publication No. JP-A-H10-193549 discloses a decorative trim and laminated film in which a metallic thin film is formed on a transparent film layer by subjecting Pb, Al, Sn, In or an alloy thereof to a vacuum metallization treatment such as sputtering, resistance heating vacuum vapor deposition, or an electron beam method.

SUMMARY OF THE INVENTION

Thus, an object of the present invention is to obtain at high productivity and low cost a metallic coating having a sheen and having a discontinuous structure by using sputtering.

In order to solve the problems described above, the present invention employs the following means (1) to (3):

(1) A resin product that comprises a resin base material and a metallic coating having a sheen and a discontinuous structure. The metallic coating is deposited on the resin base material so as to include a portion in which a high-formation metal that relatively readily forms a discontinuous structure when using vacuum vapor deposition is sputtered, and after the high-formation metal is sputtered, a low-formation metal that does not relatively readily form a discontinuous structure when using vacuum vapor deposition is sputtered. The high-formation metal and the low-formation metal are selected from at least two species of metals whose crystal structures are identical and whose lattice constant difference is within 10%.

(2) A manufacturing method for a resin product that comprises the step of depositing a metallic coating having a sheen and a discontinuous structure on the resin base material. The depositing step includes the steps of sputtering a high-formation metal that relatively readily forms a discontinuous structure when using vacuum vapor deposition, and after sputtering the high-formation metal, sputtering a low-formation metal that does not relatively readily form a discontinuous structure when using vacuum vapor deposition. The high-formation metal and the low-formation metal are selected from at least two species of metals whose crystal structures are identical and whose lattice constant difference is within 10%. Preferably, a step in which a low-formation metal is sputtered before the high-formation metal is sputtered may be added.

(3) A deposition method for a metallic coating that comprises the steps of sputtering a high-formation metal that relatively readily forms a discontinuous structure when using vacuum vapor deposition, and after sputtering the high-formation metal, sputtering a low-formation metal that does not relatively readily form a discontinuous structure when using vacuum vapor deposition. The high-formation metal and the low-formation metal are selected from at least two species of metals whose crystal structures are identical and whose lattice constant difference is within 10%. Preferably, a step in which a low-formation metal is sputtered before the high-formation metal is sputtered may be added.

Each of the elements in these means is illustrated in the following examples.

1. Resin Base Material

The form of the resin base material is not limited in particular, but a base board, a sheet material, a film and the like may be mentioned as examples. The resin for the base material is not limited in particular, but a thermoplastic resin is preferable, and PCs (polycarbonates), acrylic resins, polystyrenes, PVCs (polyvinyl chlorides), and polyurethanes may be mentioned as examples.

2. Undercoating

In the present invention, an undercoating (that forms a backing for the metallic coating) may either be deposited or not deposited on the resin base material. The undercoating is not limited in particular, but the following undercoatings may be mentioned as examples:

(1) An Undercoating Made of an Organic Compound

A coating film formed by coating the base material with an organic coating material (an acrylic coating material or the like) may be mentioned as an example. The coating thickness thereof is preferably about 0.5 to 20 μm.

(2) An Undercoating Made of an Inorganic Compound

A coating film formed by coating the base material with an inorganic coating material (having as a principal component a metallic compound such as $SiO_2$, $TiO_2$, $Si_3N_4$ or the like) and a thin film made of a metallic compound that is applied by using a physical vacuum vapor deposition method may be mentioned as examples.

3. Metallic Coating 3-1 The Sputtering Metal

In the present invention, the point to be considered is that making a solid solution (alloy) of a high-formation metal that readily forms a discontinuous structure and a low-formation metal that does not readily form a discontinuous structure enables obtaining a metallic coating having a sheen and a discontinuous structure (sea-island structure) according to a mechanism to be explained below. Thus, the sputtering metals include at least two species of metal that readily form an alloy structure, whose crystal structures are identical, and whose lattice constant difference is within 10%. Having an identical crystal structure means that the Bravais lattices, which are the base units of an atomic arrangement, are identical. Examples of the Bravais lattices include a face centered cubic lattice, a hexagonal close-packed lattice, and a body-centered cubic lattice or the like. The following TABLE 1 shows the crystal structures and the lattice constants, as cited in the *Chemical Encyclopedia*, for the principal metals that are assumed to be the target metals for vacuum vapor deposition or sputtering.

TABLE 1

| | Metal | | | | | |
|---|---|---|---|---|---|---|
| | In | Al | Sn | Ag | Cr | Zn |
| Lattice Constant (nm) | 0.4588<br>0.4938 | 0.44145 | unclear | 0.4078 | 0.28796 | 0.2659<br>0.4937 |
| Crystal Structure | Face centered cubic lattice | Face centered cubic lattice | Square lattice (having other allotropes) | Face centered cubic lattice | Body-centered cubic lattice | Close-packed hexagonal lattice |

| | Metal | | | | | |
|---|---|---|---|---|---|---|
| | Ni | Au | Pt | Cu | Pd | Fe |
| Lattice Constant (nm) | 0.3517 | 0.40705 | 0.39235 | 0.360775 | 0.49396 | 0.2860<br>0.364<br>0.293 |
| Crystal Structure | Face centered cubic lattice | Face centered cubic lattice | Face centered cubic lattice | Face centered cubic lattice | Face centered cubic lattice | Body-centered cubic lattice or Face centered cubic lattice |

| | Metal | | | | |
|---|---|---|---|---|---|
| | Co | Ti | Si | Mo | Ir |
| Lattice Constant (nm) | 0.2514<br>0.4105<br>0.3554 | unclear | 0.542 | 0.31399 | 0.38392 |
| Crystal Structure | Close-packed hexagonal lattice or Face centered cubic lattice | Close-packed hexagonal Or Equiaxed crystal | Diamond type | Body-centered cubic lattice | Face centered cubic lattice |

Here, the high-formation metals that relatively readily form a discontinuous structure when using vacuum vapor deposition are In, Sn, Cr, and the like. Therefore, among the low-formation metals that do not relatively readily form a discontinuous structure when using vacuum vapor deposition, the following combinations which are readily alloyed with In and Cr or the like, may be mentioned as examples:

(a) a combination in which the high-formation metal is In and the low-formation metal is Al or Pd (b) a combination in which the high-formation metal is Cr and the low-formation metal is Fe, Mo, or the like Note that because the lattice constant of Sn, which is a high-formation metal, is unclear, there are no combinations that may be mentioned as examples.

3-2 Sputtering Order

As described above, the present invention includes a step in which the high-formation metal and the low-formation metal are sputtered in the recited order (i.e., the high-formation metal is sputtered, and after the high-formation metal is sputtered, the low formation metal is sputtered). Furthermore, a step may be added in which the low-formation metal is sputtered before the high-formation metal is sputtered.

3-3 Sputtering Conditions

The conditions for the sputtering are not limited in particular, but in the following explanation and examples, the sputtering is carried out by using a sputtering apparatus made by Kawai Optics and using a DC magnetron method, wherein the attained degree of vacuum was $5.0\times10^{-3}$ Pa and the temperature in the chamber is at room temperature. In addition, the deposition speed for the high-formation metal is preferably 0.4 to 2 nm/sec (more preferably, 0.6 to 1 nm/sec) and for the low-formation metal is preferably 0.05 to 0.4 nm/sec (more preferably, 0.1 to 0.2 nm/sec).

3-4 Sputtering Time

The sputtering time is decided depending on the deposition speed, but in the case in which the resin product is, for example, a millimeter wave radar apparatus cover, and when carrying out sputtering at the deposition speeds described in 3-3 above, the following ranges are preferable.

First, the sputtering time for the high-formation metal is preferably 25 to 55 seconds (more preferably, 30 to 40 seconds). When the sputtering time is 25 seconds or less, a sheen that is preferable for the emblem design characteristics cannot be obtained. Specifically, the metallic coating becomes transparent, and the light transmittance becomes excessive. In contrast, when the sputtering time is 40 seconds or more, for example, the millimeter wave transparency begins to decrease, and at 55 seconds or more, product ratings are not satisfied.

Next, the sputtering time for the low-formation metal when carried out after sputtering the high-formation metal is preferably 3 to 20 seconds (more preferably, 5 to 15 seconds). When the sputtering time is 3 seconds or less, time control is difficult. In contrast, when the sputtering time is 20 seconds or more, there is a tendency for the color tone to become blurred.

Furthermore, the sputtering time for the low-formation metal when carried out before sputtering the high-formation metal is preferably 3 to 5 seconds. When the sputtering time is 3 seconds or less, the time control is difficult. In contrast, when the sputtering time is 5 seconds or more, the electrical resistance of the metallic coating decreases, and accompanying this, the millimeter wave transparency tends to degrade.

3-5 Thickness of the Metallic Coating

The thickness of the metallic coating is not limited in particular, but 10 to 100 nm is preferable (more preferably, 15 to 50 nm). The reason for this is that when the coating thickness is less than 10 nm, the sheen tends to decrease, while the coating thickness exceeds 100 nm, the electrical resistance tends to become low, and for example, the millimeter wave transparency tends to degrade.

3-6 Mechanism by Which the Metallic Coating Acquires a Discontinuous Structure

It is understood that a metallic coating will readily acquire a sheen and a discontinuous structure (sea-island structure) by depositing the metallic coating by including the steps of sputtering a high-formation metal that relatively readily forms a discontinuous structure when using vacuum vapor deposition and thereafter sputtering a low-formation metal that does not relatively readily form a discontinuous structure when using vacuum vapor deposition, which the high-formation metal and the low-formation metal are selected from at least two species of metals whose crystal structures are identical and whose lattice constant difference is within 10%. This mechanism is conjectured as follows.

As can be understood by comparing the microscopic photograph of the In vacuum vapor deposition coating shown in FIG. 4 described below and the microscopic photograph of the In sputtering coating shown in FIG. 5, even in the case of using the same metal, In, the metal particles in the sputtered coating are densely packed in comparison to the vacuum vapor deposited coating. In addition, FIG. 2 shows the relationship between the thickness of the coating and the light transmittance by comparing the vacuum vapor deposited coating and the sputtering coating. As shown in this figure, even when the coatings have the same light transmittance, the thickness of the vacuum vapor deposited coating is large while the thickness of the sputtering coating is small. Based on this, it is considered that the film growth of the vacuum vapor deposited coating is promoted in the longitudinal direction. Specifically, it is assumed that the vacuum vapor deposited coating acquires the cross-section schematically shown in FIG. 3A and that the sputtered coating acquires the cross-section schematically shown in FIG. 3B (this is also demonstrated based on the differences in conductivity).

The sputtering phenomenon denotes a phenomenon in which atoms, molecules, or clusters are ejected. Below, the combination of In, which is a high-formation metal that relatively readily forms a discontinuous structure, and Al, which is a low-formation metal that does not relatively readily form a discontinuous structure, will be explained as an example. With respect to the In coating that has already been sputtered on the base material, the subsequently sputtered particles of Al may either cause the ejection of the In coating or may accumulate on the In coating.

In contrast, as described above, In and Al, whose crystal structures are identical, and whose lattice numbers are close, are easily alloyed, and it is considered that the energy of this alloy is lower than the energy of the In alone and thus is stable. Therefore, due to this stabilization energy, the phenomenon in which the Al particles stay on the base material as an alloy coating is promoted.

Thus, in conclusion, it is conjectured that when conditions in which the alloy can be produced in this manner are satisfied, with respect to the thin film portion (the portion encircled in FIG. 3B) of the In coating, the sputtering phenomenon occurs with priority, and in other thick portions thereof, the alloying phenomenon occurs with priority. Specifically, the point is the balance between the phenomenon in which particles stay on the base material by being alloyed and the phenomenon in which particles are ejected from the base material, and it is considered that the object (imparting a morphology having a sea-island structure as in vacuum vapor deposition) is realized only through the action of the stabilization energy due to alloying.

Alternatively, it is considered that even when using metals that do not produce an alloy (for example, Ag, Ti, and the like with respect to In, as described below) to replace Al, as a result of only the sputtering phenomenon occurring with priority, the In coating overall is simply reduced, and a sea-island structure similar to that of the vacuum vapor deposited coating, which is the object, cannot be formed. Another possibility is that the non-alloying metal will simply accumulate on the In coating conforming to the shape thereof, and the morphology of the film overall will tend to be flat.

Therefore, the metal to be considered for replacing In must be a metal that acquires a discontinuous structure to a certain degree (because an incomplete one is satisfactory) even when used alone. In addition, the metal considered to replace In must be a metal that is compatible with the conditions in which an alloy is produced (Al is most suitable for In).

In addition, based on the results of example 1, comparative example 4, and comparative example 5 in TABLE 2 described below, it is indispensable that the Al is sputtered after the In is sputtered. This is demonstrated by the fact that the electrical resistance value of the metallic coating changes drastically before and after sputtering the Al.

Furthermore, preferably the Al is sputtered also before the In is sputtered. Although there is the possibility that the Al particles themselves will serve as growth nucleuses and promote thereby the formation of the morphology of the In coating, it is considered that when the alloying mechanism described above occurs under a high energy plasma state, a mixed Al and In existing as far as possible in a positionally uniform distribution causes readily the mechanism, and it is thus considered that the presence of the Al in the backing for the In as well is positionally preferable.

4. Other Films and the Like

Preferably, a protective film is formed on the metallic coating in order to protect this metallic coating. In the case in which the lower surface side of the resin base material is a design surface, a press coating film or the like may be formed as a protective film on the metallic coating. Furthermore, a resin backing material may be injection molded onto the press coating. In contrast, in the case in which the upper surface side of the metallic coating is a design surface, a clear top coating film or the like may be formed as a protective film on the metallic coating.

5. Types (Uses) of a Resin Product

Because the metallic coating is discontinuous, the metallic coating has a high electrical resistance. Thereby, properties such as millimeter wave transparency and a lightning protecting capacity are present. Furthermore, because of its discontinuity, the spread of corrosion is suppressed, so that corrosion resistance is present. In addition, the discontinuous metallic coating readily conforms to the curved surfaces of the resin base material. The types (uses) of resin products that can be realized due to having these qualities are not limited in particular, but the following may be mentioned as examples:

(a) Use in a millimeter wave radar apparatus cover may be mentioned as an example of the use for taking advantage of the millimeter wave transparency. The part to which this cover is applied is not limited in particular, but use in an external application product for an automobile is preferable, and in particular, suitable for a radiator grill, a grill cover, side moldings, back panels, bumpers, emblems, and the like.

(b) Use in an umbrella or the like may be mentioned as an example of the use for taking advantage of the lightning protecting capacity.

(c) Use in a printed circuit board may be mentioned as an example of the use for taking advantage of the property that only treated areas are electrically insulating.

(d) Use in an emblem, a radiator grill, and a shiny molding may be mentioned as an example of the use for taking advantage of the corrosion resistance characteristic.

(e) Use in elastic shiny moldings may be mentioned as an example of the use for taking advantage of conforming to curved surfaces.

(f) In addition, use in containers for use in a microwave oven may be mentioned as an example of the use for taking advantage of the infrared transparency.

According to the present invention, a metallic coating that has a sheen and has a discontinuous structure can be obtained at high productivity and low cost by using sputtering.

DETAILED DESCRIPTION OF THE PREFERRED EMBODIMENTS

Figure 1:
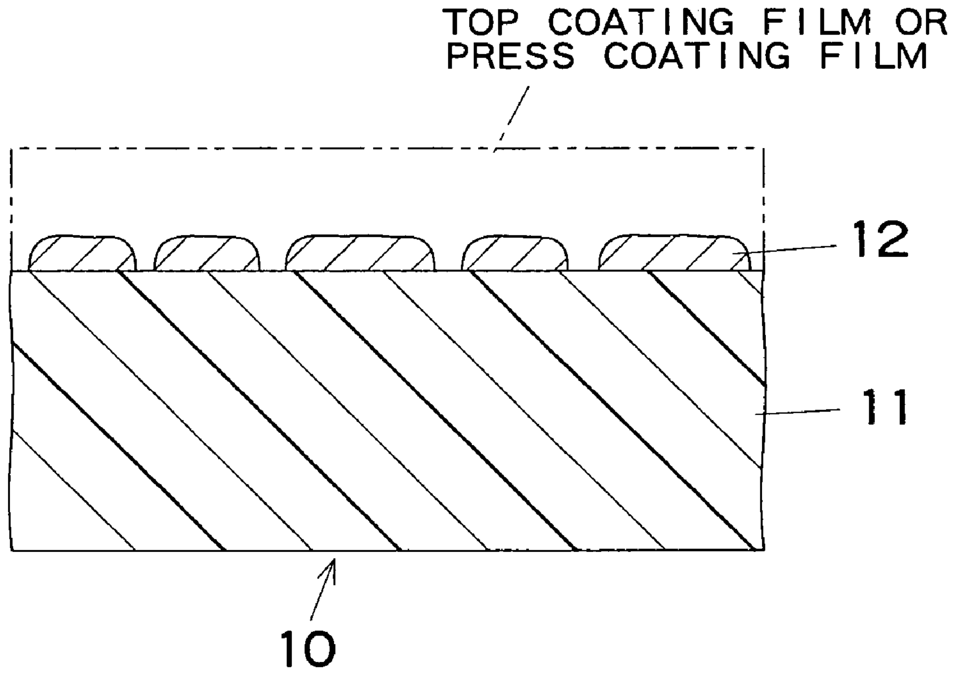
FIG. 1 is a cross-sectional view showing the resin product of an embodiment of the present invention.
Figure 2:
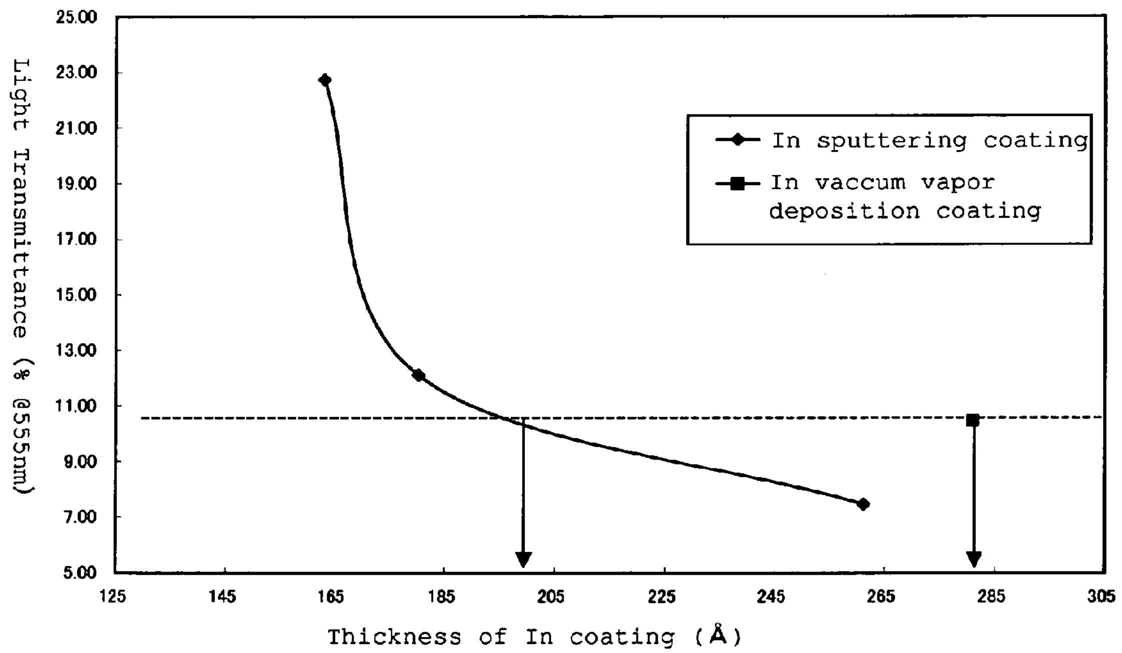
FIG. 2 is a graph showing the relationship between the thickness and the light transmittance of the In coating.
Figure 3:
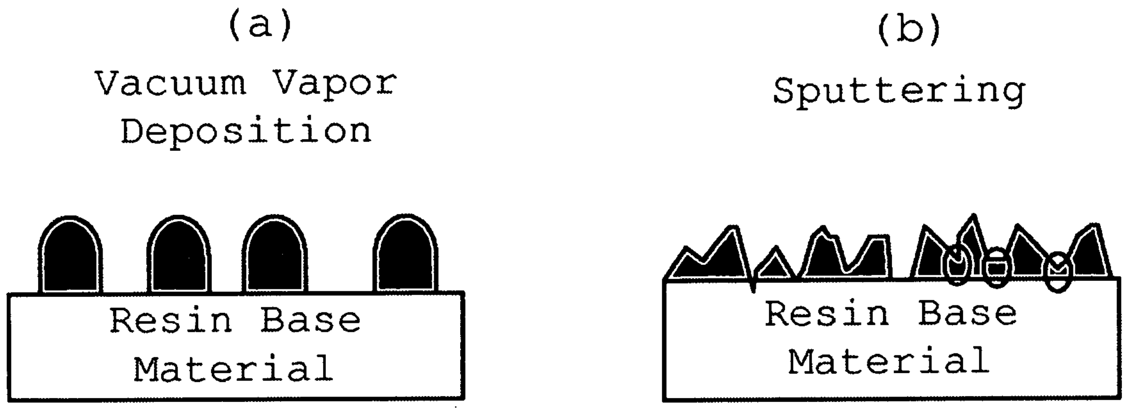
FIG. 3A is a cross-sectional view schematically showing the vacuum vapor deposited coating.
FIG. 3B is a cross-sectional view schematically showing the sputtered coating.

A resin product 10 (for example, a millimeter wave radar apparatus cover) shown in FIG. 1 includes a plate-shaped resin base material 11 and a metallic coating 12 which has a sheen and a discontinuous structure. The metallic coating 12 is deposited on the resin base material 11 so as to include a portion in which a high-formation metal that relatively readily forms a discontinuous structure when using vacuum vapor deposition is sputtered and thereafter a low-formation metal that does not readily form a discontinuous structure when using vacuum vapor deposition is sputtered. The high-formation metal and the low-formation metal are selected from at least two species of metals whose crystal structures are identical and whose lattice constant difference is within 10%. A top coating film, a press coating film or the like are formed on the metallic coating 12 as a protective film.

This resin product 10 is produced by the following steps. The resin base material 11 is, for example, a 5 mm thick plate made of a PC (polycarbonate).

(1) Among the at least two species of metal, a low-formation metal is sputtered on the resin base material 11.

(2) Subsequently, among the at least two species of metal, a high-formation metal is sputtered.

(3) Thereafter, among the at least two species of metal, a low-formation metal is sputtered.

Thereby, a metallic coating 12 is deposited that includes an alloyed portion consisting of the high-formation metal and the low-formation metal, and that has a sheen and a discontinuous structure.

The sputtering used the sputtering apparatus made by Kawai Optics described above, and was carried out by using a DC magnetron method, wherein the attained degree of vacuum is $5.0\times10^{-3}$ Pa and the temperature in the chamber was at room temperature. In addition, the deposition speed was 0.6 to 1 nm/sec for the In and Pd and 0.1 to 0.2 nm/sec for Al, Ti, and Ag.

EXAMPLES

As shown in TABLE 2, the metallic coatings in examples 1 to 4 and comparative examples 1 to 6 were deposited directly (without providing an undercoating layer) on a PC base material, and the metallic coating in example 5 was deposited on an undercoating formed on a PC base material, and the thickness, the composition, morphology, electrical resistance value, millimeter wave transparency, the AES molding characteristics, and light transmittance of the metallic coatings were investigated respectively. The morphology was observed by using an electron microscope. The AES molding characteristics were observed by forming a resin back layer that made of an AES resin on the metallic coating by insert injection molding and then determining whether the metallic coating corroded due to the heat that was applied at that time.

Figure 4:
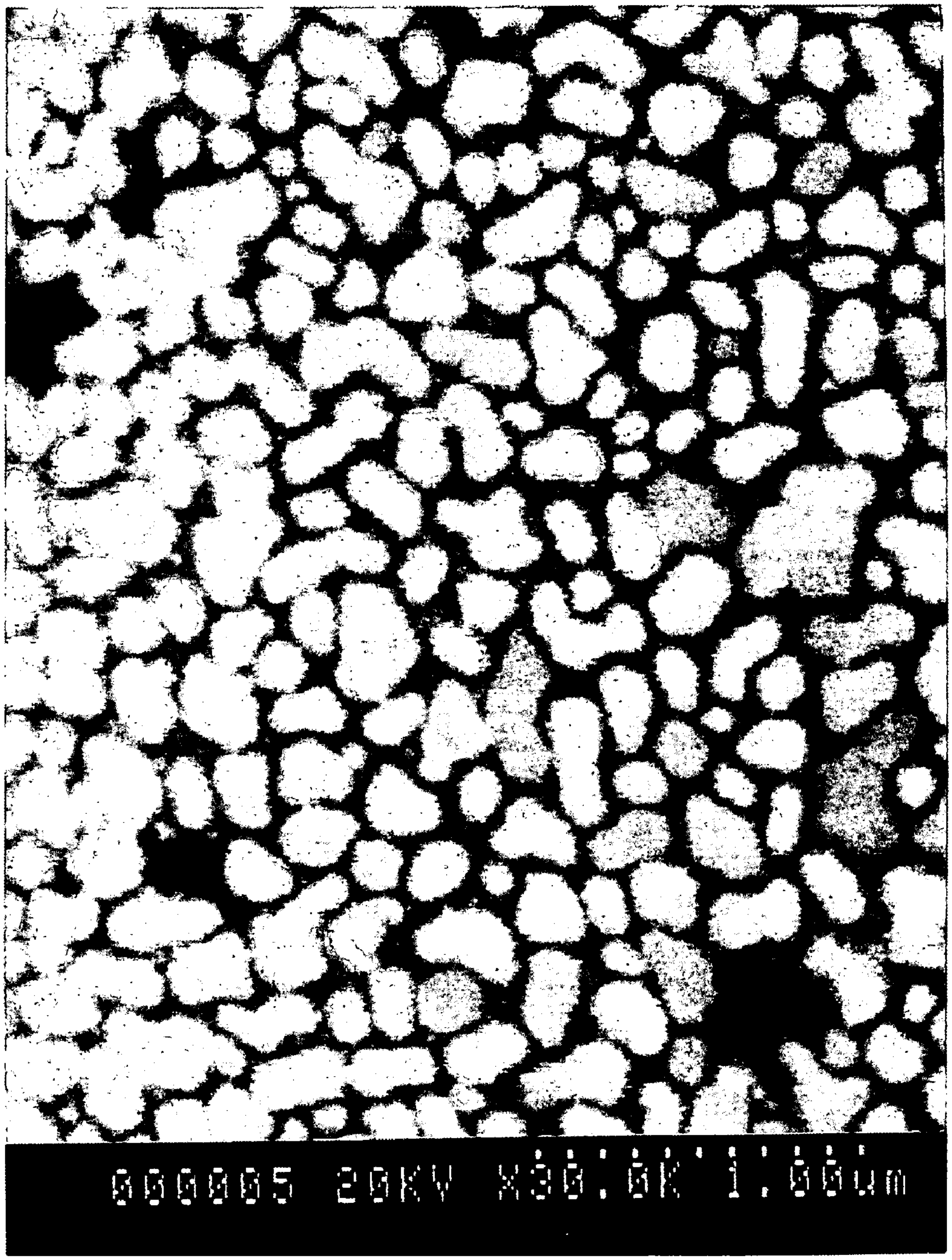
FIG. 4 is a microscope photograph of the metallic coating of comparative example 1.

Comparative example 1 is an example in which In was vacuum vapor deposited for 30 seconds. A metallic coating having a sheen and, as shown in FIG. 4, having a discontinuous structure was formed.

Figure 5:
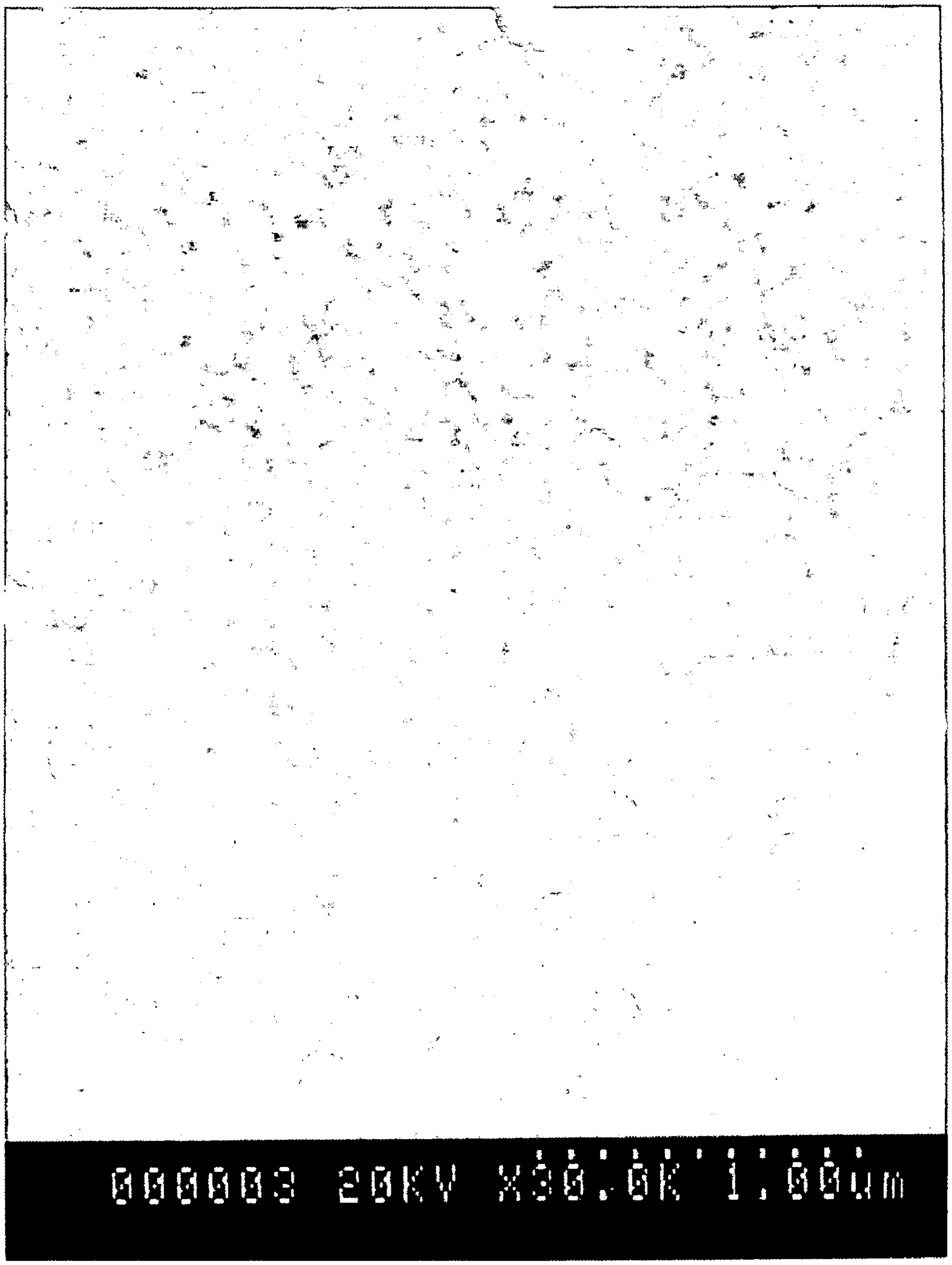
FIG. 5 is a microscope photograph of the metallic coating of comparative example 2.

Comparative example 2 is an example in which In was sputtered for 35 seconds. A metallic coating having a sheen but, as shown in FIG. 5, having an insufficient discontinuous structure was formed.

Figure 6:
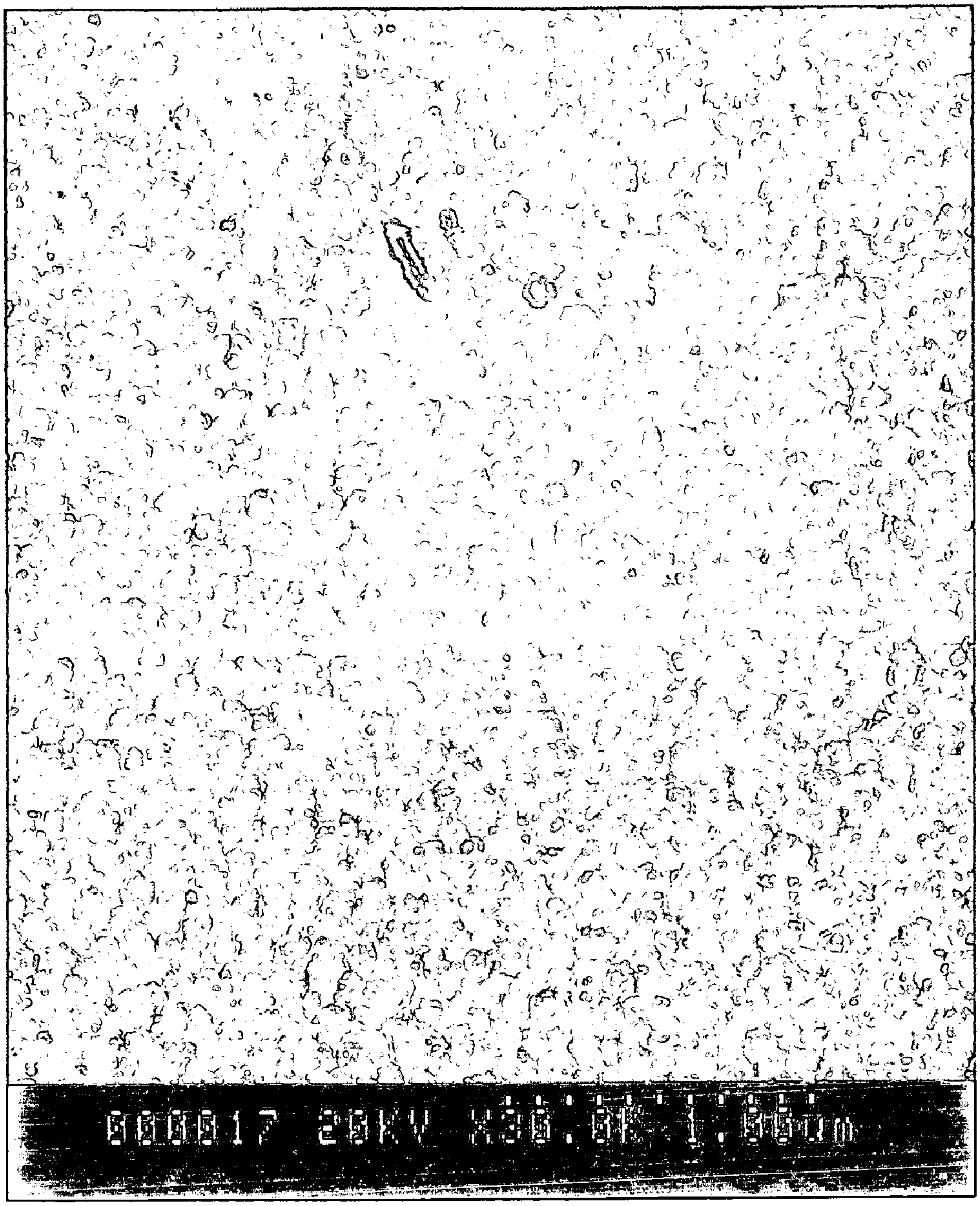
FIG. 6 is a microscope photograph of the metallic coating of example 1.

Example 1 is an example in which Al was sputtered for 3 seconds, and then the process was switched to sputtering In for 35 seconds. Subsequently, the process was switched again to sputtering Al for 7 seconds. A metallic coating having a sheen and, as shown in FIG. 6, having a discontinuous structure was formed. Both the millimeter wave transparency and the AES molding characteristics were excellent. In this manner, it was confirmed that a metallic coating having a sufficient sheen and a discontinuous structure could be obtained by sputtering that has a higher productivity than vacuum vapor deposition.

Figure 7:
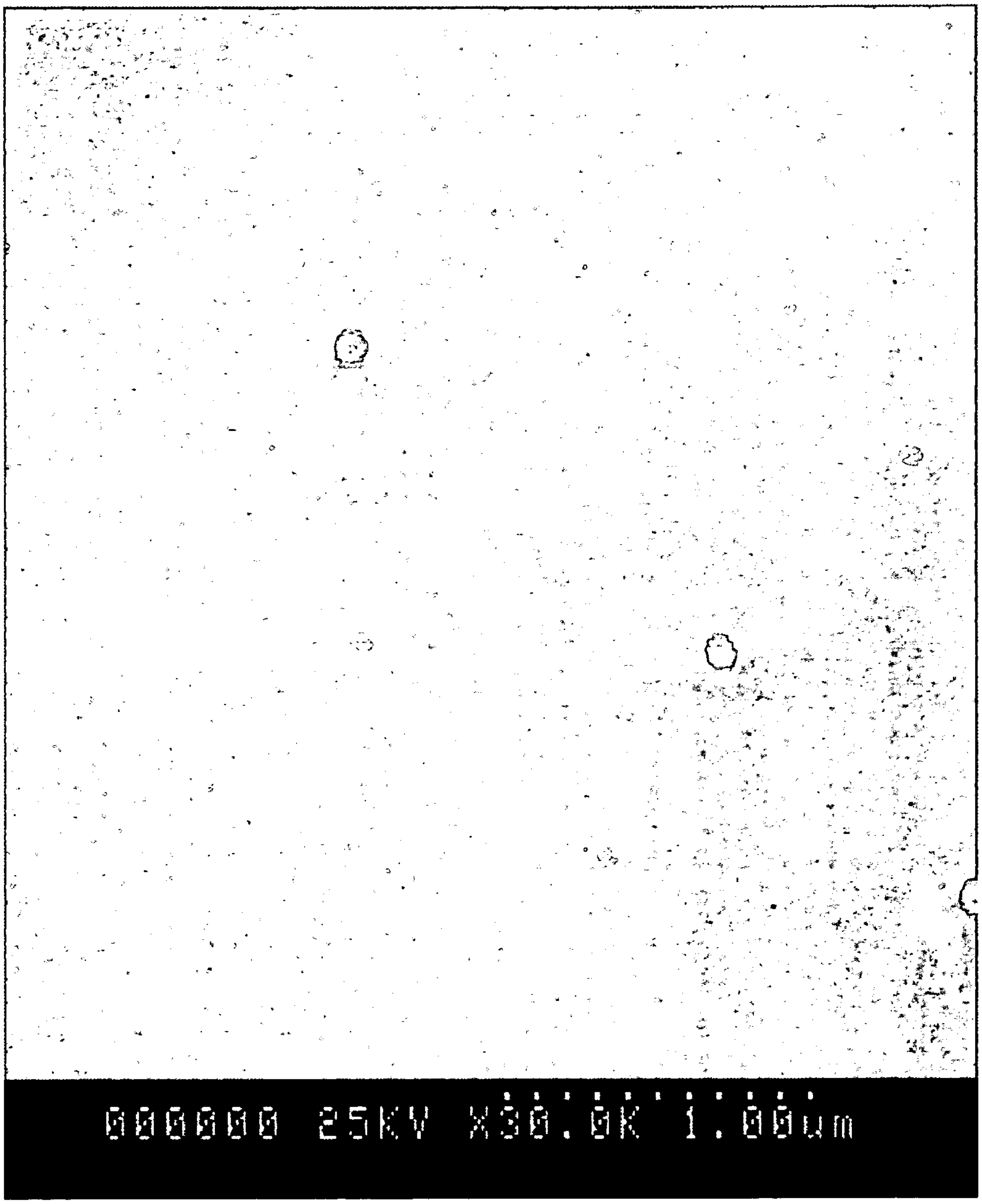
FIG. 7 is a microscope photograph of the metallic coating of comparative example 3.

Comparative example 3 is an example in which Al was sputtered for 7 seconds. A metallic coating having a poor sheen and, as shown in FIG. 7, having a discontinuous structure was formed.

Figure 8:
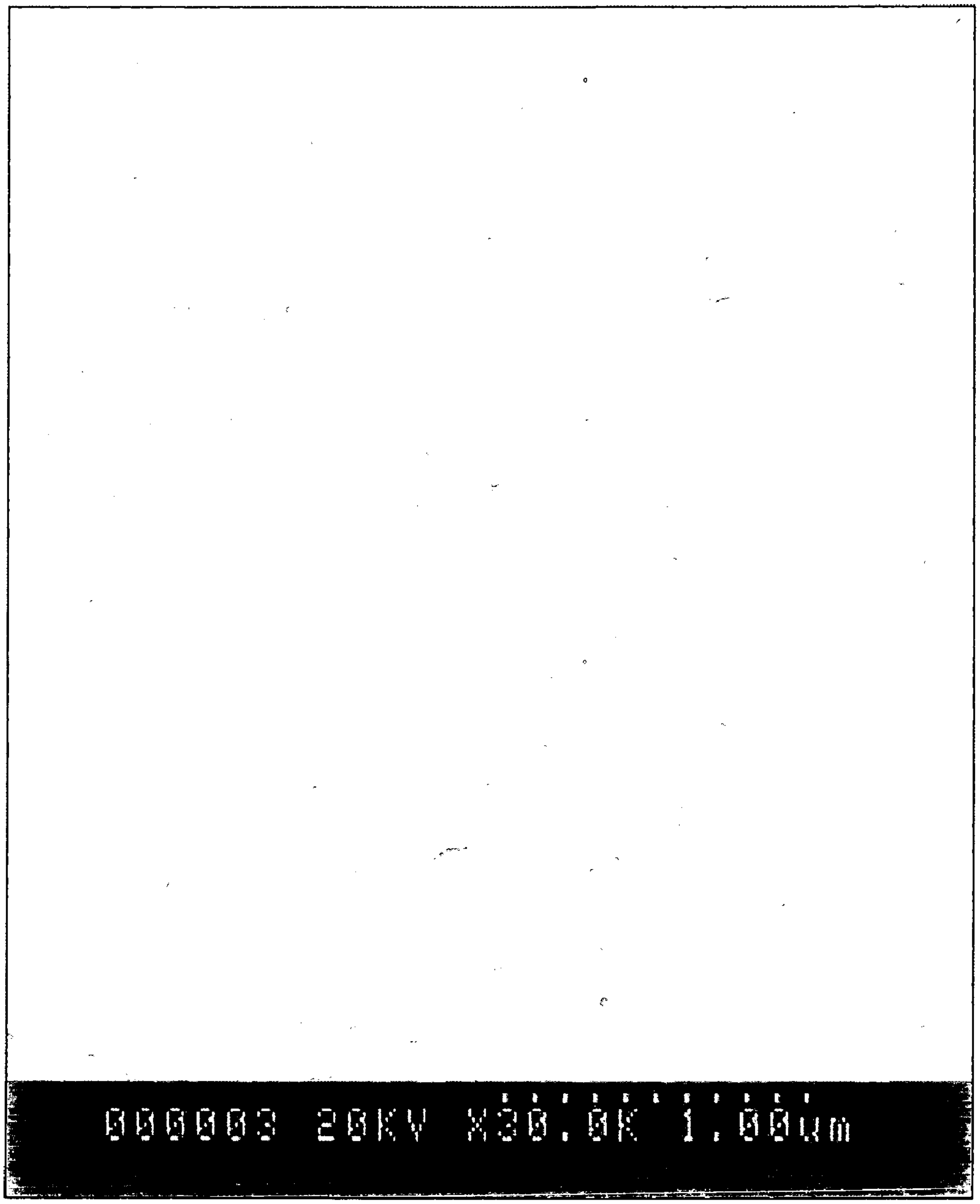
FIG. 8 is a microscope photograph of the metallic coating of comparative example 4.

Comparative example 4 is an example in which Al was sputtered for 3 seconds, and then the process was switched to sputtering In for 35 seconds. A metallic coating having a sheen, but as shown in FIG. 8, having an insufficient discontinuous structure was formed.

Example 2 is an example in which In was sputtered for 35 seconds, and then the process was switched to sputtering Al for 7 seconds. A metallic coating having a sheen and, as

TABLE 2

Figure 9:
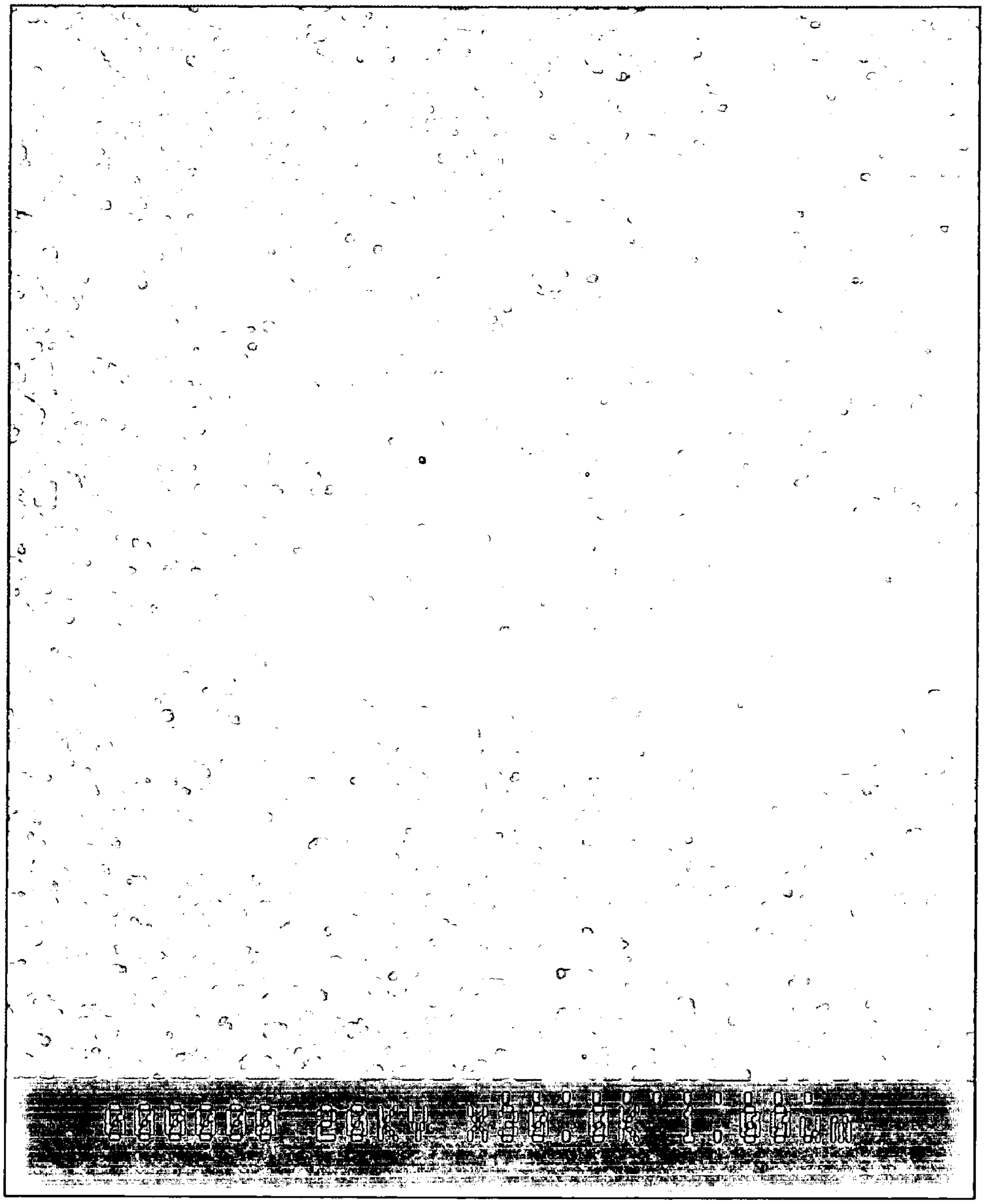
FIG. 9 is a microscope photograph of the metallic coating of example 2.

| | | | Metallic Coating | | | | | | |
|---|---|---|---|---|---|---|---|---|---|
| No. | Deposition Method | Target Material (Sputtering Time/second) | Coating Thickness | Composition | Morphology | Electrical Resistance Value (Ω/□) | Mllimeter Wave Transparency | AES Molding Characteristics (corrosion resistance) | Light Transmittance (@555 nm) |
| Comparative Example 1 | vacuum vapor deposition | In (vacuum vapor deposited for 30) | 46 nm | In alone | ○ (FIG. 4) | $10^8$ | ○ | ○ | 7% |
| Comparative Example 2 | Sputtering | In (35) | 26 nm | In alone | x (FIG. 5) | $10^4$ | x | Δ | 7% |
| Example 1 | Sputtering | Al → In → Al (3) (35) (7) | 30 nm | Alloy of In/Al | ○ (FIG. 6) | $10^{13}$ | ○ | ○ | 5.6% |
| Comparative Example 3 | Sputtering | Al (7) | — | Al alone | — (FIG. 7) | — | — | — | — |
| Comparative Example 4 | Sputtering | Al → In (3) (35) | 26 nm | In alone | x (FIG. 8) | $10^3$ | x | x | 5.5% |
| Example 2 | Sputtering | In → Al (35) (7) | 26 nm | Alloyed only in upper to intermediate layer portions | ○ (FIG. 9) | $10^7$ | ○ | Δ | 5.5% |
| Example 3 | Sputtering | Pd → In → Pd (5) (35) (10) | 28 nm | — | ○ (FIG. 10) | $10^{11}$ | ○ | ○ | 10.2% |
| Comparative Example 5 | Sputtering | Ti → In → Ti (3) (35) (7) | About 25 nm | — | — | — | x | — | 5.5% |
| Comparative Example 6 | Sputtering | Ag → In → Ag (3) (35) (7) | about 25 nm | — | — | — | x | — | 5.5% |
| Example 4 | Sputtering | Al → In → Al (5) (45) (20) | 40 nm | Alloy of In/Al | — | $10^{13}$ | ○ | ○ | 3.5% |
| Example 5 | Sputtering | $Si_3N_4$ (5 nm) Undercoating treatment Al → In → Al (5) (55) (20) | 50 nm | Alloy of In/Al | — | $10^{13}$ | ○ | ○ | 2.0% |

shown in FIG. 9, having a discontinuous structure was formed. The millimeter wave transparency was excellent, but the AES molding characteristics were not as excellent as those of Example 1 (tolerance range).

Figure 10:
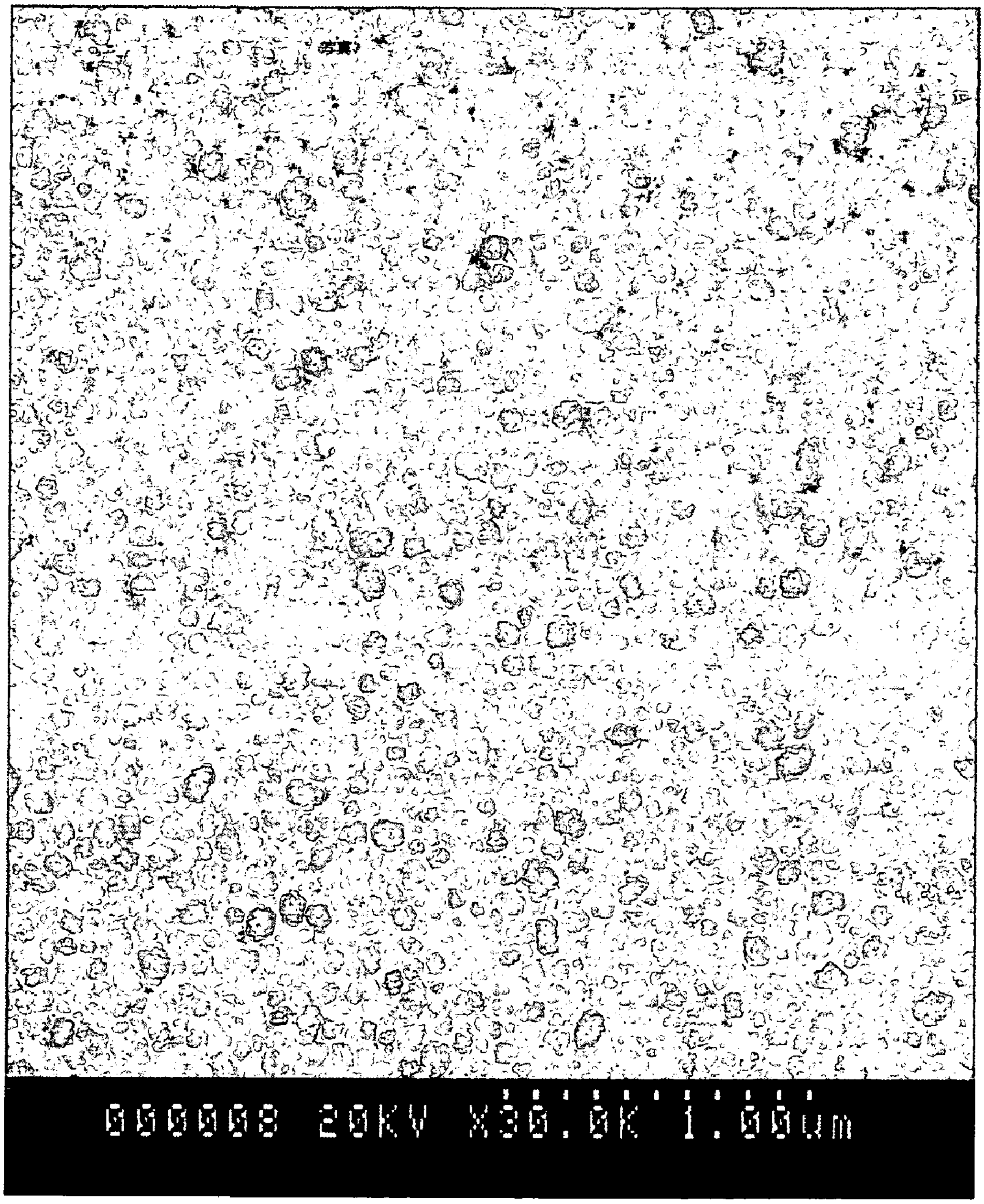
FIG. 10 is a microscope photograph of the metallic coating of example 3.

Example 3 is an example in which Pd was sputtered for 5 seconds, and then the process was switched to sputtering In for 35 seconds. Subsequently, the process was switched again to sputtering Pd for 10 seconds. A metallic coating having a sheen and, as shown in FIG. 10, having a discontinuous structure was formed. Both the millimeter wave transparency and the AES molding characteristics were excellent.

Comparative example 5 is an example in which Ti was sputtered for 3 seconds, and then the process was switched to sputtering In for 35 seconds. Subsequently, the process was switched again to sputtering Ti for 7 seconds. A metallic coating having a sheen but having an insufficient discontinuous structure was formed.

Comparative example 6 is an example in which Ag was sputtered for 3 seconds, and then the process was switched to sputtering In for 35 seconds. Subsequently, the process was switched again to sputtering Ag for 7 seconds. A metallic coating having a sheen but having an insufficient discontinuous structure was formed.

Example 4 is an example in which Al was sputtered for 5 seconds, and then the process was switched to sputtering In for 45 seconds. Subsequently, the process was switched again to sputtering Al for 20 seconds. A metallic coating having a sheen and a discontinuous structure was formed. Both the millimeter wave transparency and the AES molding characteristics were excellent.

Example 5 is an example in which, first, a 5 nm coating film made of $Si_3N_4$, which served as an undercoating, was formed on a PC base material, and Al was then sputtered for 5 seconds on this undercoating. Subsequently, the process was switched to sputtering In for 55 seconds followed by switching the process again to sputtering Al for 20 seconds. A metallic coating having a sheen and a discontinuous structure was formed. Both the millimeter wave transparency and the AES molding characteristics were excellent.

Note that the present invention is not limited by the examples described above, and may be practiced by making appropriate modifications that do not depart from the spirit of the invention.

What is claimed is:

1. A resin product, comprising:

a resin base material; and a metallic coating having a sheen and a discontinuous structure that is deposited on the resin base material, the metallic coating comprising a portion in which a high-formation metal that relatively readily forms a discontinuous structure when using vacuum vapor deposition is sputtered, and after the high-formation metal is sputtered, a low-formation metal that does not relatively readily form a discontinuous structure when using vacuum vapor deposition is sputtered, wherein the high-formation metal and the low-formation metal are selected from at least two species of metals whose crystal structures are identical and whose lattice constant difference is within 10%; and wherein the high-formation metal is In and the low-formation metal is at least one of Al and Pd.

2. A resin product according to claim 1, wherein the metallic coating has a thickness of 10 to 100 nm.

3. A resin product according to claim 1, wherein the metallic coating comprises a portion in which the low-formation metal is sputtered before the high-formation metal is sputtered.

4. A resin product according to claim 1, wherein the high-formation metal and the low-formation metal are alloyed in the metallic coating.

* * * * *